United States Patent
Izumida et al.

(10) Patent No.: US 8,680,612 B2
(45) Date of Patent: Mar. 25, 2014

(54) SEMICONDUCTOR DEVICE AND MANUFACTURING METHOD THEREOF

(75) Inventors: Takashi Izumida, Kanagawa (JP); Nobutoshi Aoki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,400

(22) Filed: Aug. 31, 2012

(65) Prior Publication Data

US 2013/0069148 A1    Mar. 21, 2013

(30) Foreign Application Priority Data

Sep. 21, 2011 (JP) .................................. 2011-205452

(51) Int. Cl.
*H01L 29/10* (2006.01)
*H01L 29/423* (2006.01)
*H01L 29/78* (2006.01)

(52) U.S. Cl.
USPC ............ 257/332; 257/E29.262; 257/E21.119; 438/270

(58) Field of Classification Search
None
See application file for complete search history.

(56) References Cited

U.S. PATENT DOCUMENTS

| | | | | |
|---|---|---|---|---|
| 7,795,096 | B2 * | 9/2010 | Wang | 438/270 |
| 2006/0234451 | A1 | 10/2006 | Slesazeck et al. | |
| 2007/0037340 | A1 | 2/2007 | Birner et al. | |
| 2008/0012067 | A1 | 1/2008 | Wu | |
| 2008/0073709 | A1 | 3/2008 | Fujimoto et al. | |
| 2008/0157194 | A1 * | 7/2008 | Lee et al. | 257/334 |
| 2008/0224209 | A1 * | 9/2008 | Chun | 257/334 |
| 2009/0127609 | A1 * | 5/2009 | Han et al. | 257/311 |
| 2009/0315092 | A1 | 12/2009 | Mikasa | |
| 2010/0072545 | A1 * | 3/2010 | Ryu et al. | 257/334 |
| 2010/0102385 | A1 * | 4/2010 | Lee et al. | 257/331 |

FOREIGN PATENT DOCUMENTS

| | | |
|---|---|---|
| JP | 2006-54431 | 2/2006 |
| JP | 2007-49121 | 2/2007 |
| JP | 2008-22012 | 1/2008 |
| JP | 2008-103689 | 5/2008 |
| JP | 2010-3916 | 1/2010 |

OTHER PUBLICATIONS

Song, Jae Young, Jong Pil Kim, Sang Wan Kim, Jeong-Hoon Oh, Kyung-Chang Ryoo, Min.-Chul Sun, Garam Kim, Jang-Gn Yun, Hyungcheol Shin, and Byung-Gook Park. "Fin and Recess-Channel Metal Oxide Semiconductor Field Effect Transistor for Sub-50 nm Dynamic Random Access Memory Cell." Japanese Journal of Applied Physics 49.10 (2010): 104202.*

Karla, Pankaj. Advanced Source/Drain Technologies for Nanoscale CMOS. Diss. University of California, 2003. Berkeley: Electrical Engineering and Computer Sciences in the Graduate Division, 2003.*

J.Y. Kim, et al., "The Breakthrough in data retention time of DRAM using Recess-Channel-Array Transistor(RCAT) for 88nm feature size and beyond", Symposium on VLSI Technology Digest of Technical Papers, 2003, pp. 11-12.

* cited by examiner

*Primary Examiner* — Thomas L Dickey
*Assistant Examiner* — Joseph Schoenholtz
(74) *Attorney, Agent, or Firm* — Oblon, Spivak, McClelland, Maier & Neustadt, L.L.P.

(57) ABSTRACT

According to one embodiment, a semiconductor device includes an element region partitioned by an isolation region in a semiconductor substrate, and a source region and a drain region formed in a surface layer of the element region by being isolated by a gate trench along a predetermined direction across the element region. The semiconductor device includes a gate electrode formed to reach a position deeper than the source region and the drain region by embedding at least part thereof in the gate trench with a gate dielectric film interposed therebetween. An interface in the drain region, which is in contact with the gate dielectric film, includes a projection projecting toward the gate electrode side.

20 Claims, 18 Drawing Sheets

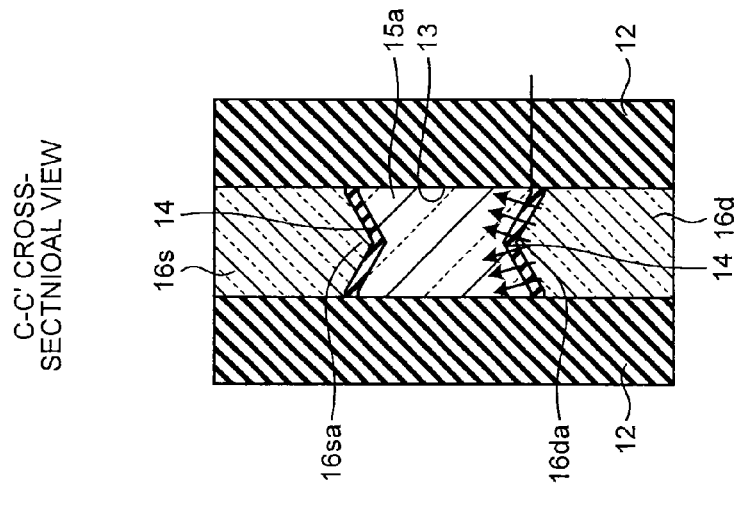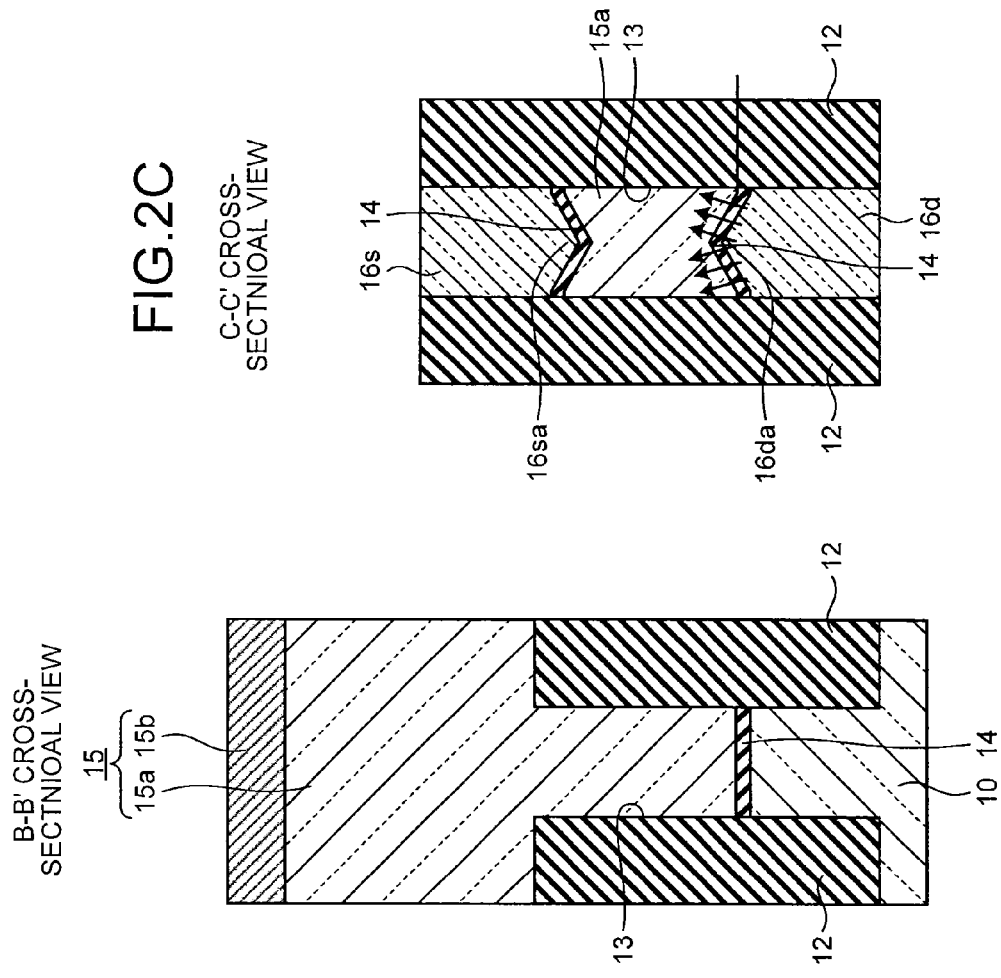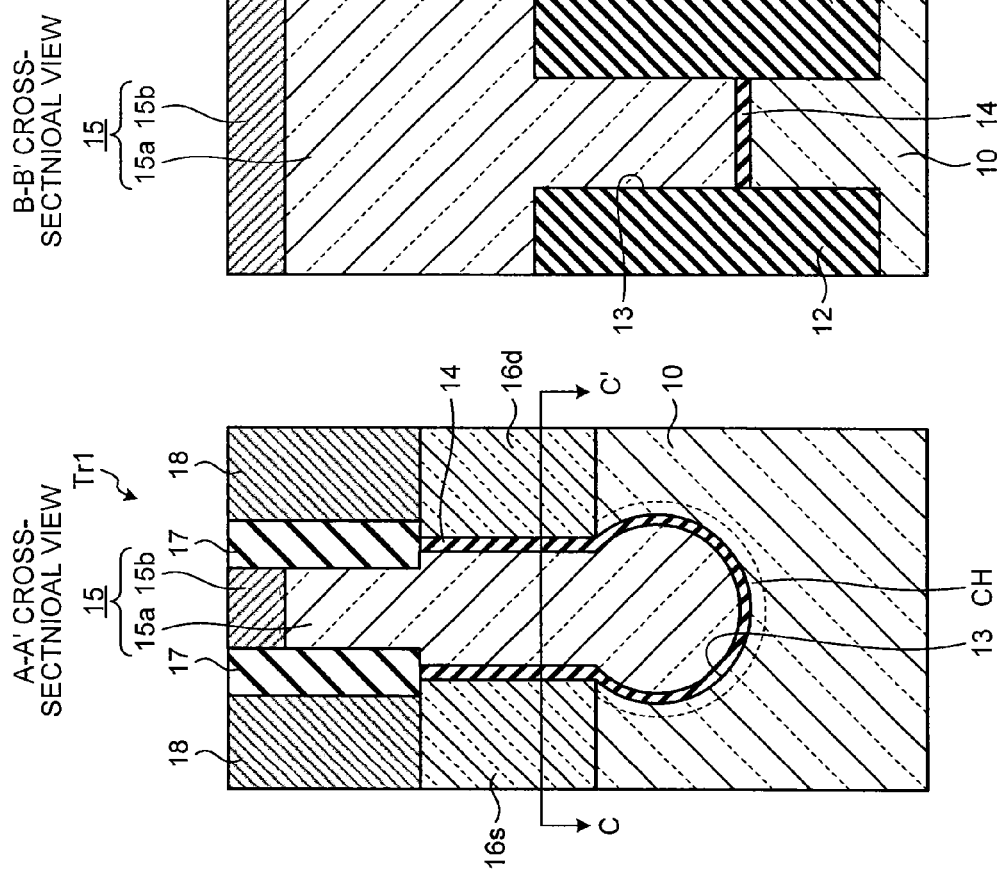

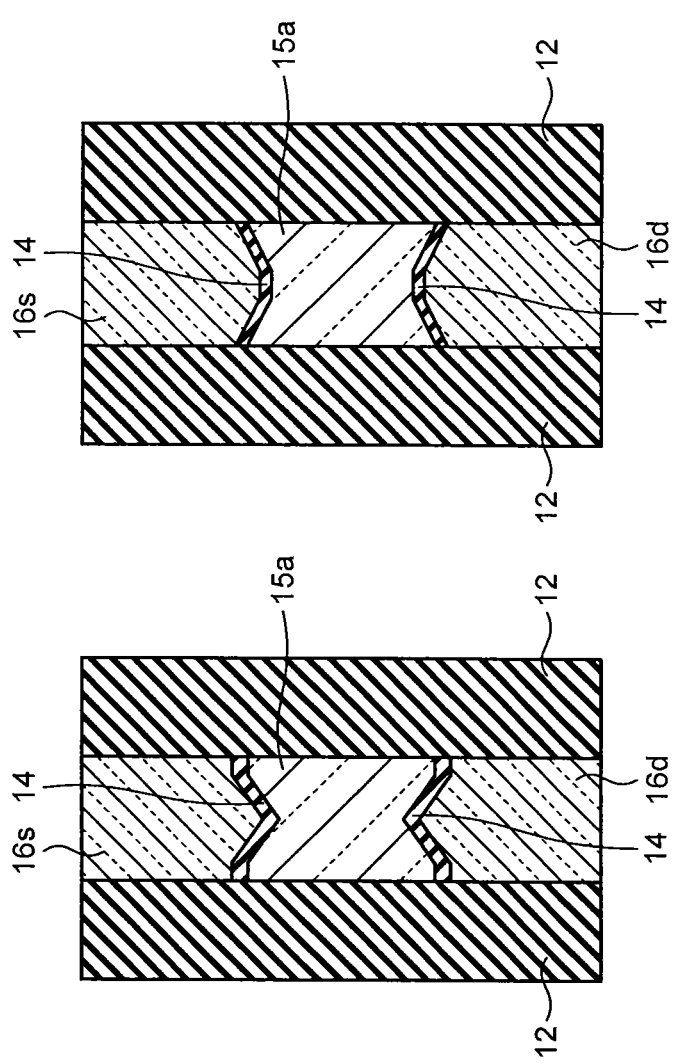

A-A' CROSS-
SECTNIOAL VIEW

B-B' CROSS-
SECTNIOAL VIEW

C-C' CROSS-
SECTNIOAL VIEW

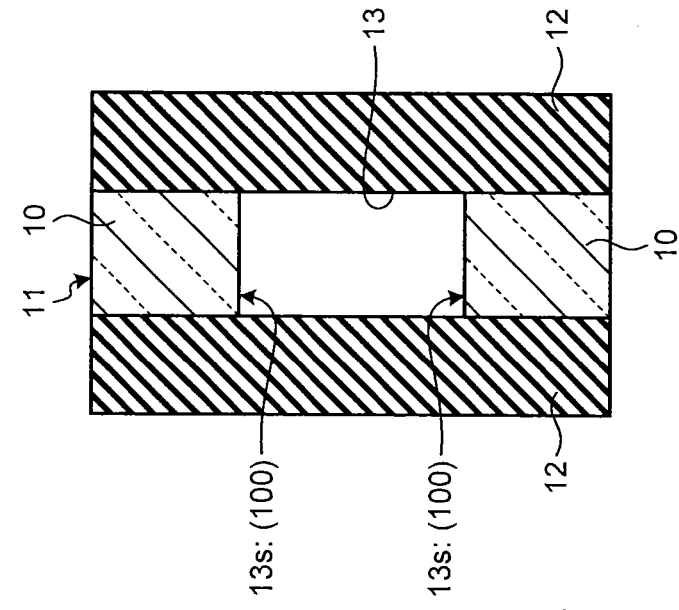
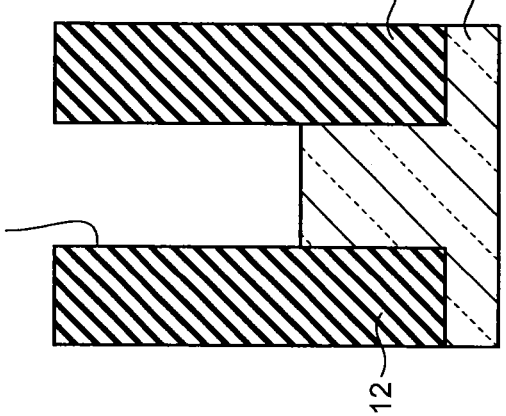
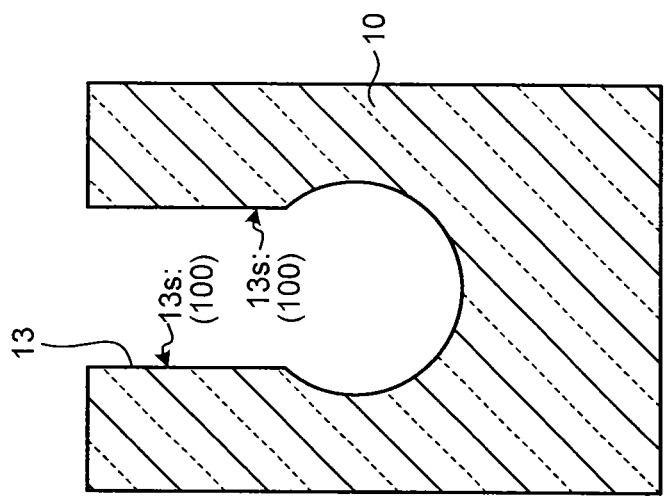

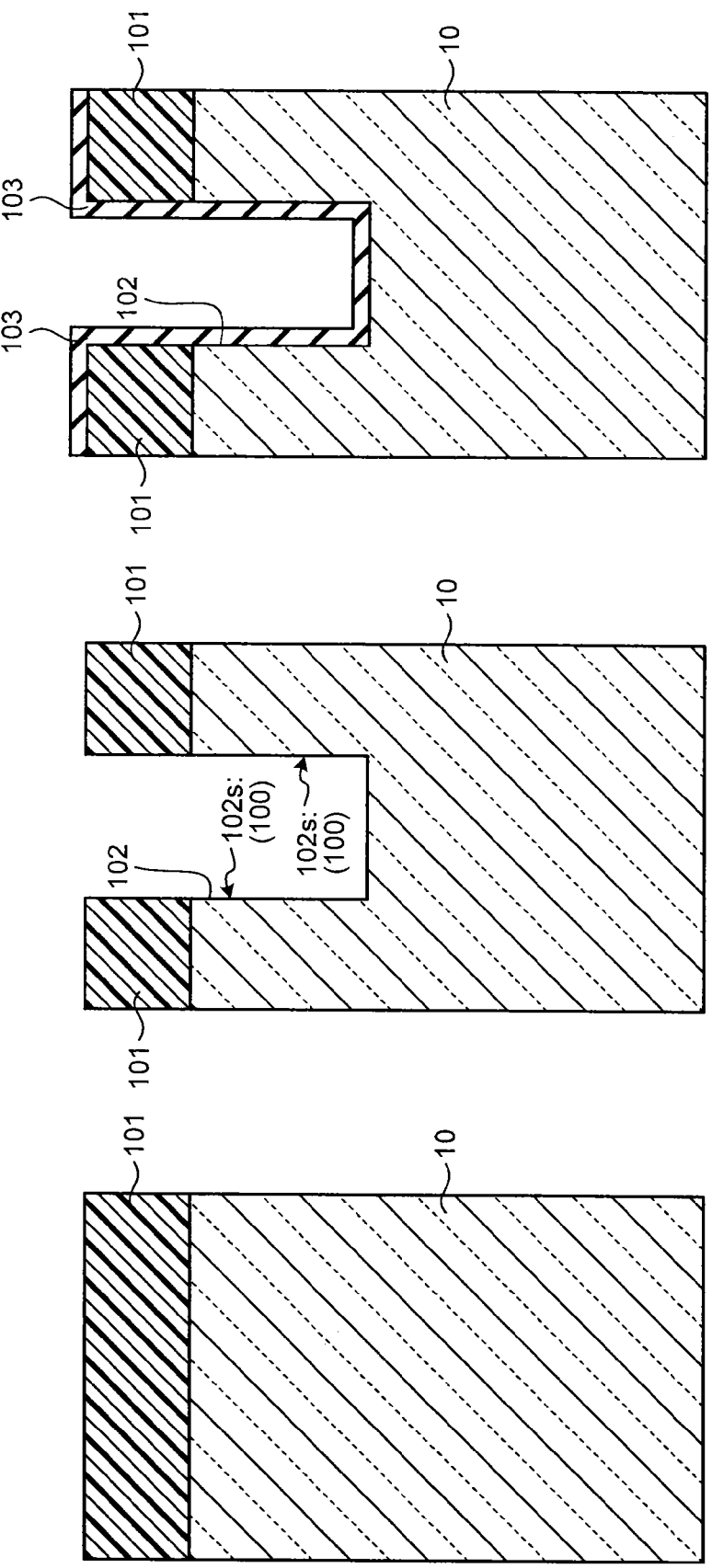

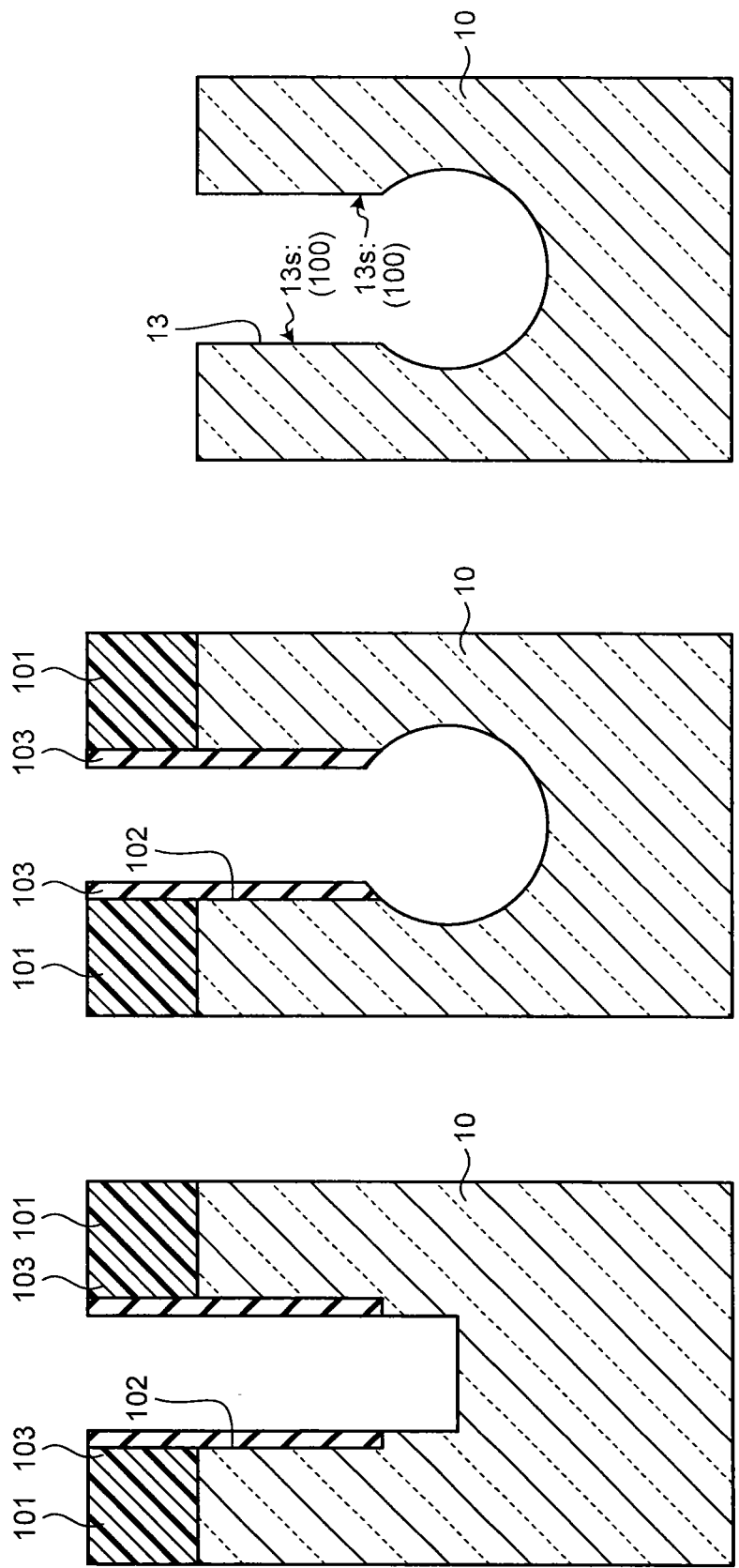

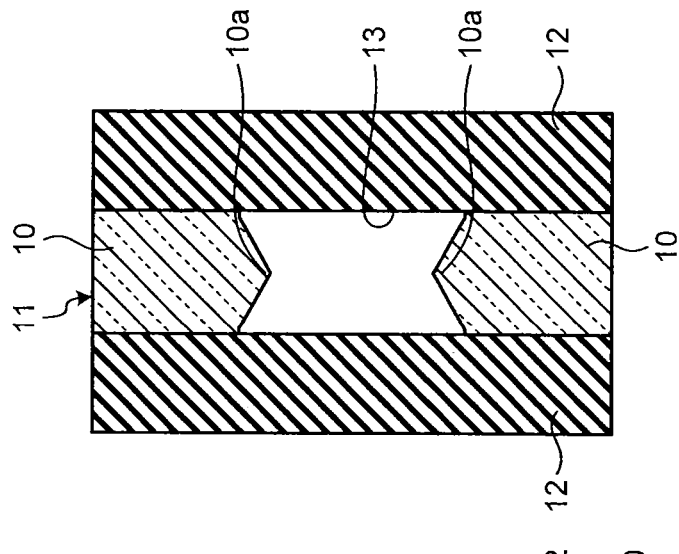
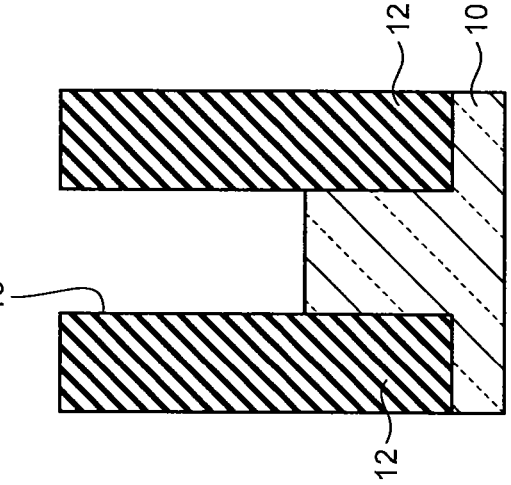
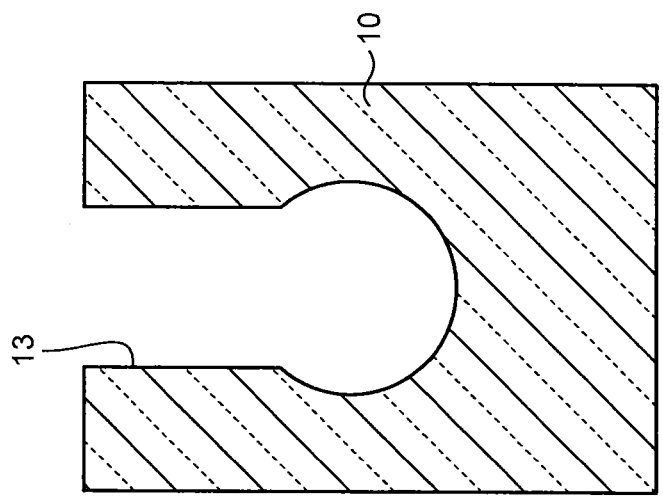

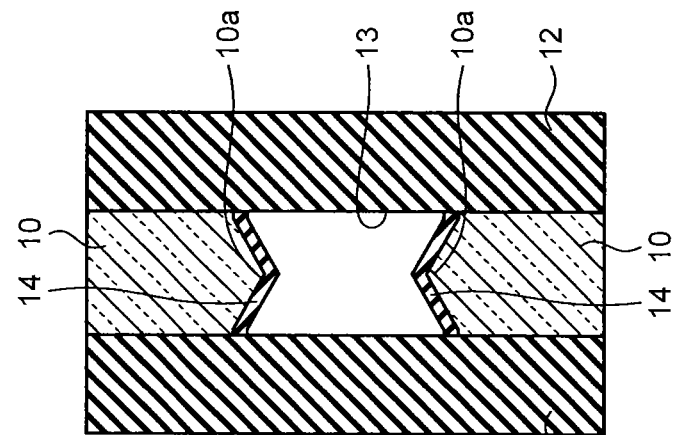
FIG.8A A-A' CROSS-SECTIONAL VIEW
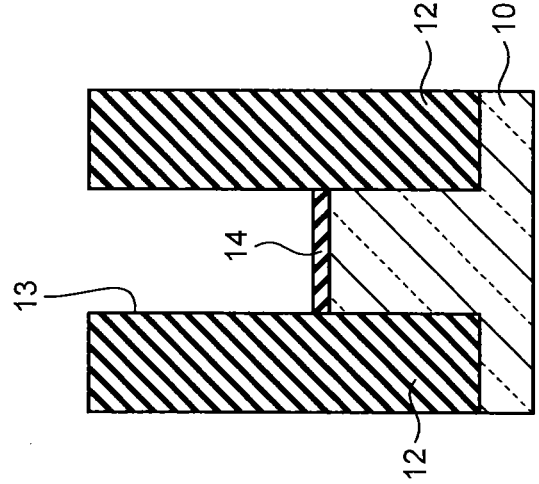
FIG.8B B-B' CROSS-SECTIONAL VIEW
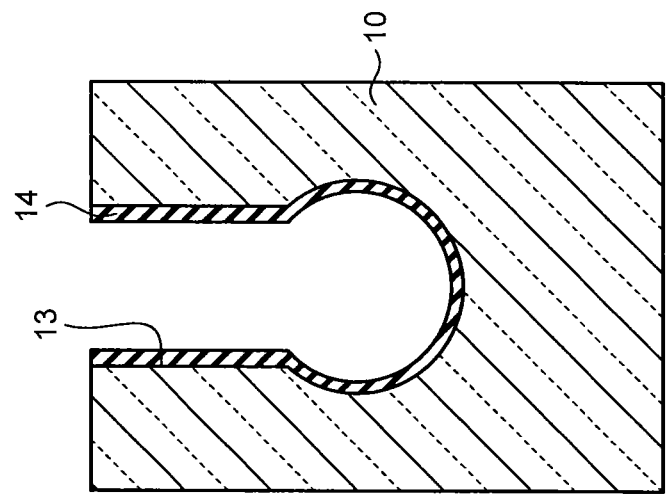
FIG.8C C-C' CROSS-SECTIONAL VIEW

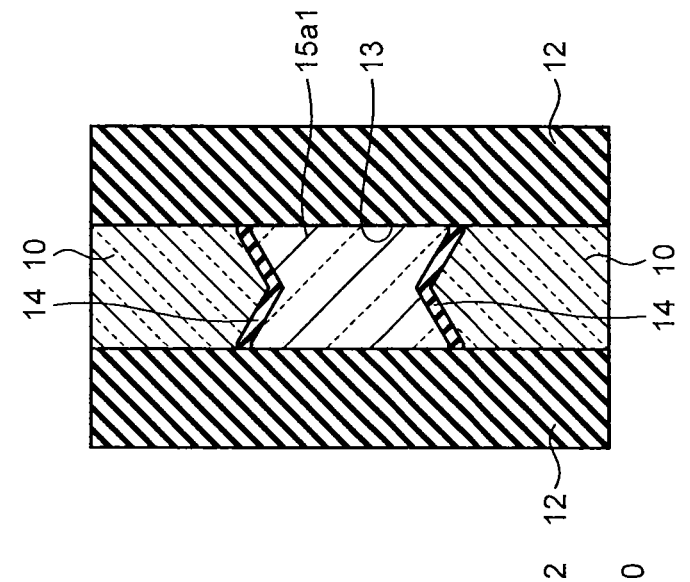
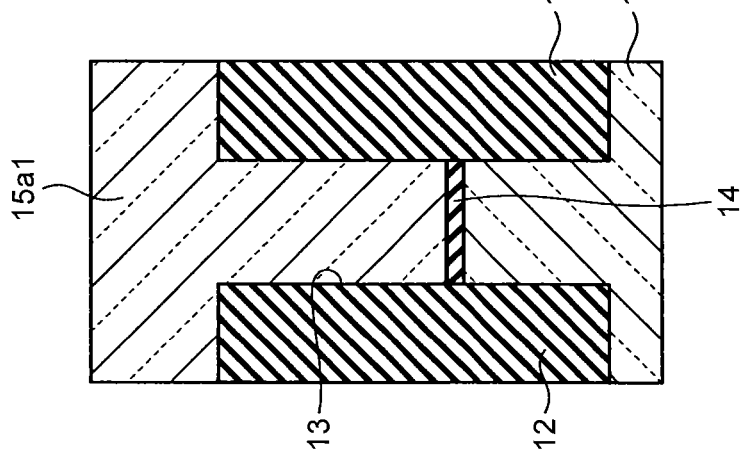
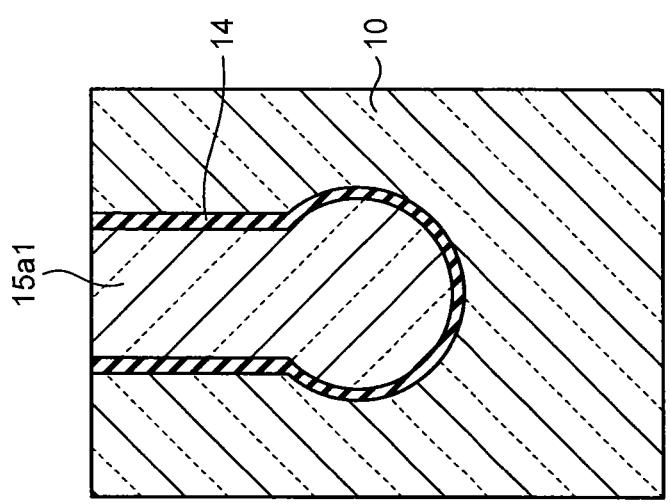

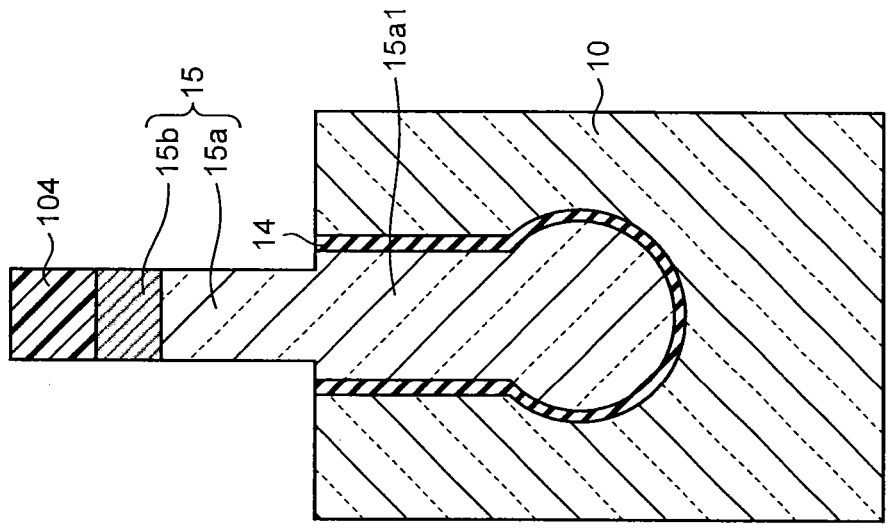
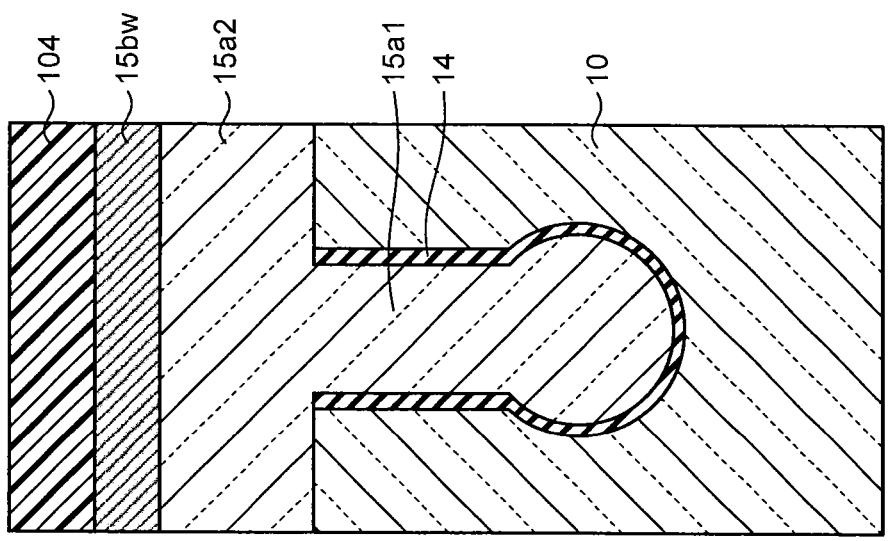
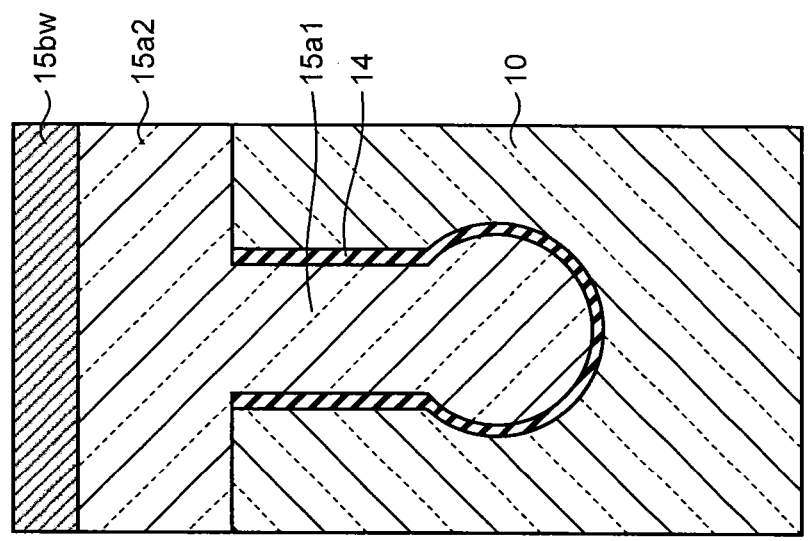

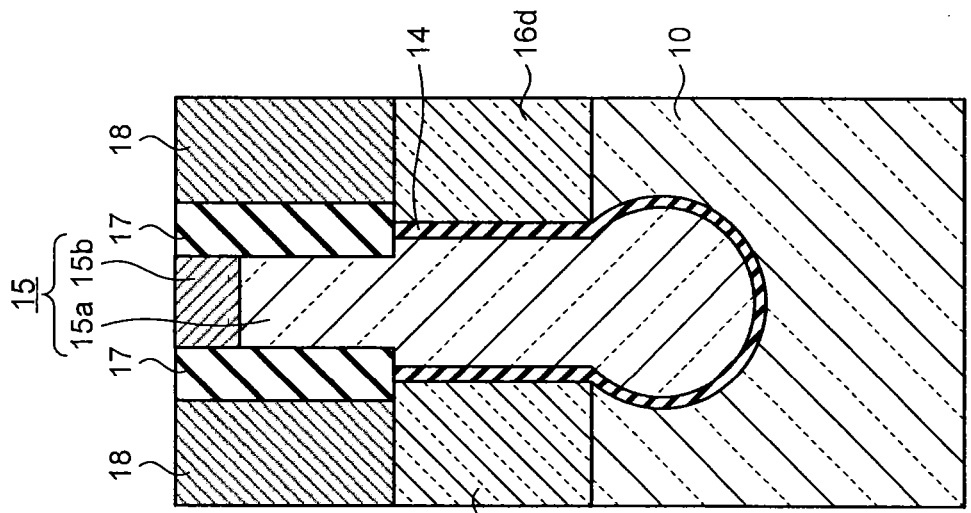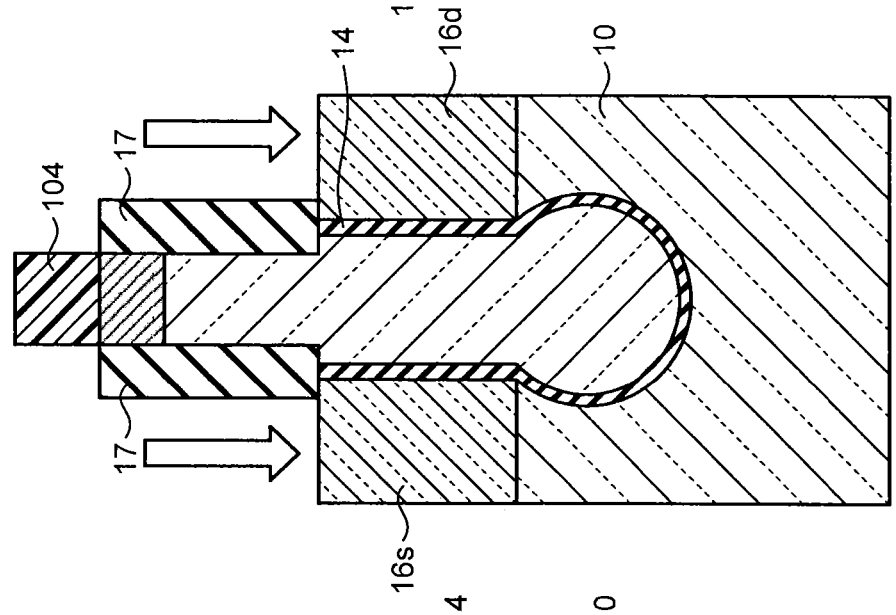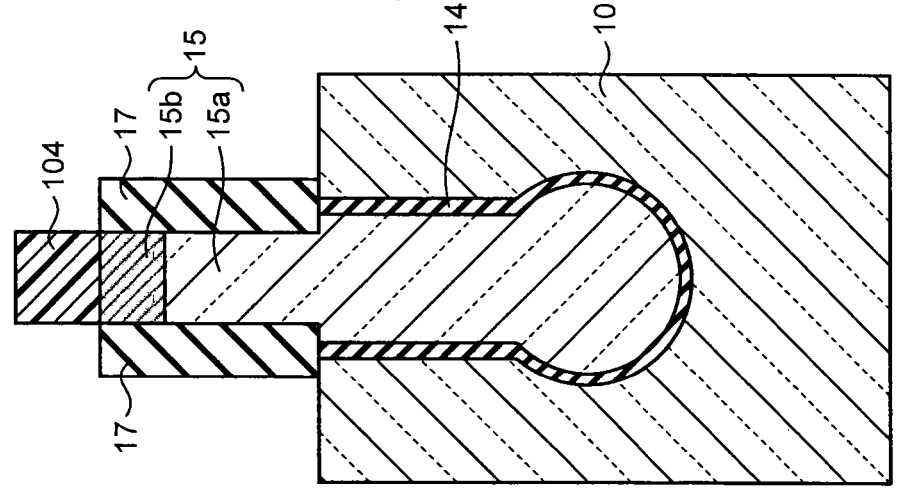

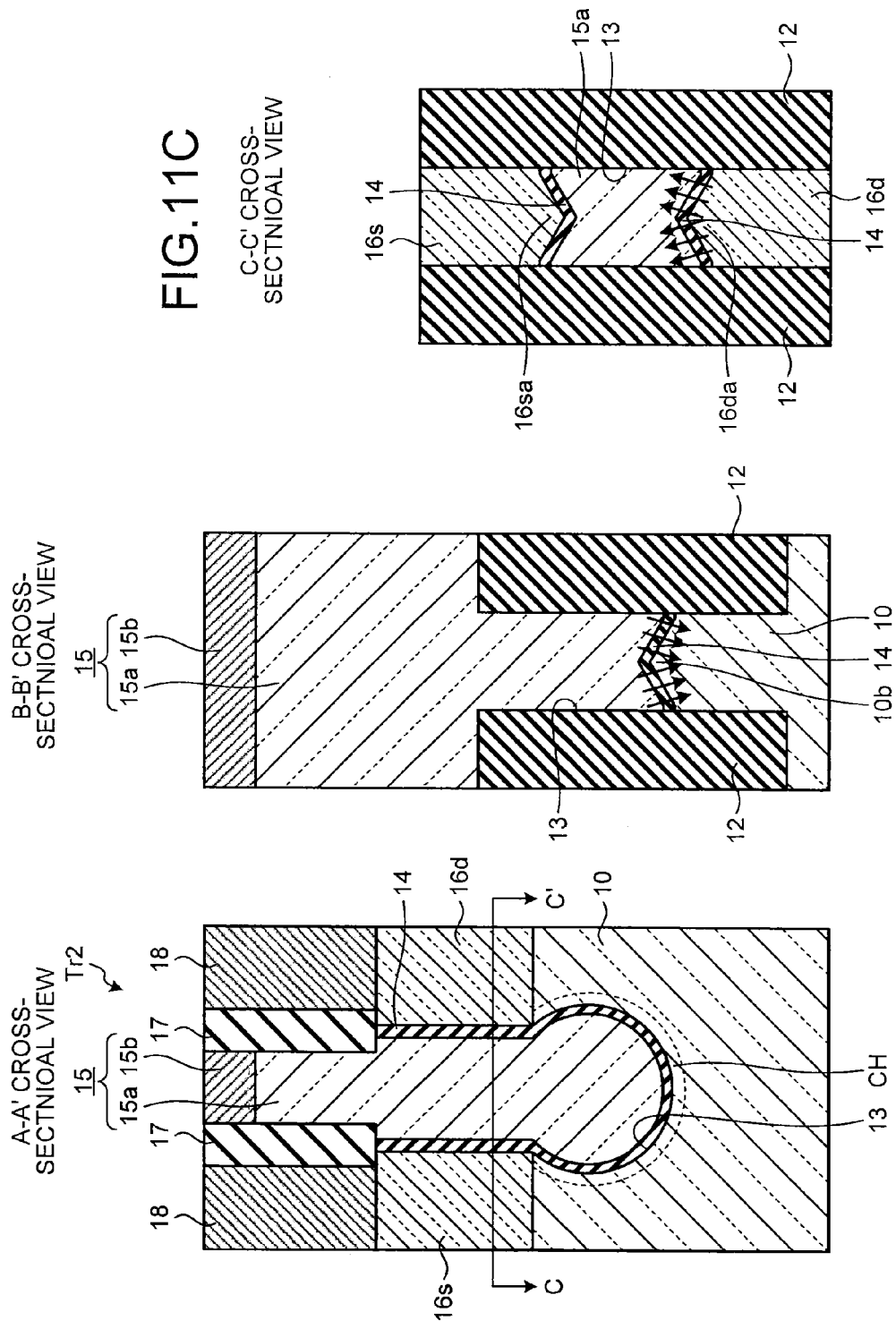

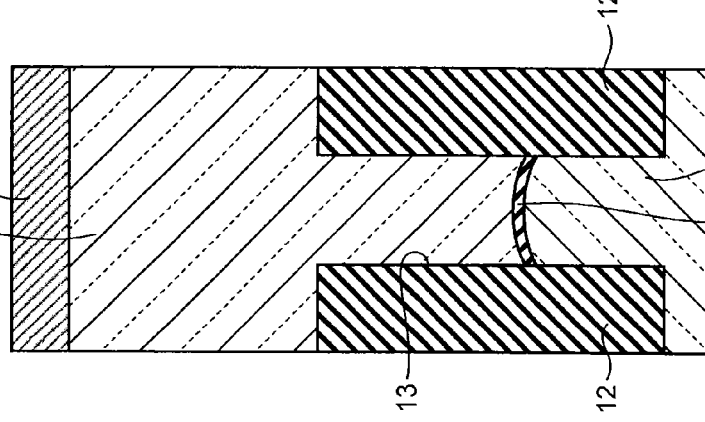
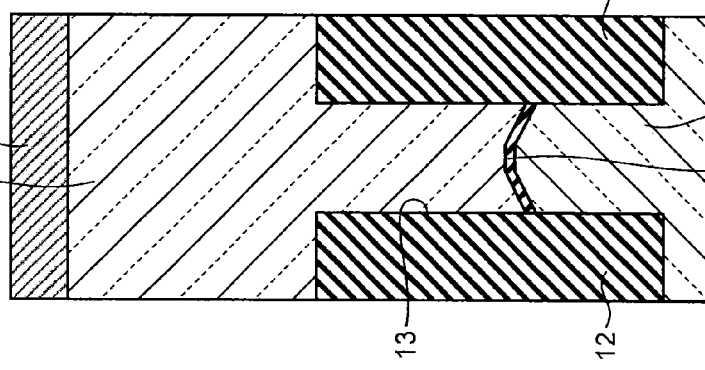
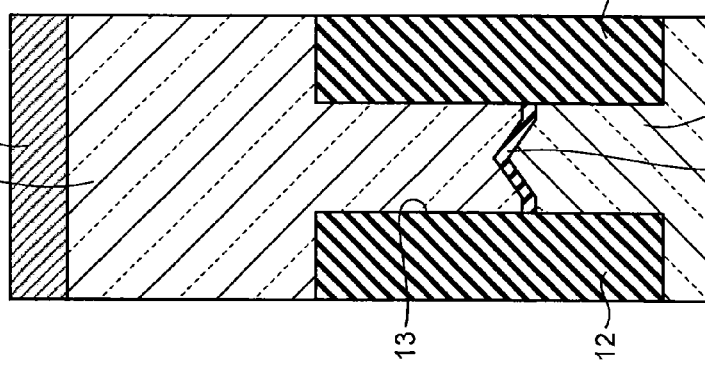

A-A' CROSS-SECTIONAL VIEW

B-B' CROSS-SECTIONAL VIEW

C-C' CROSS-SECTIONAL VIEW

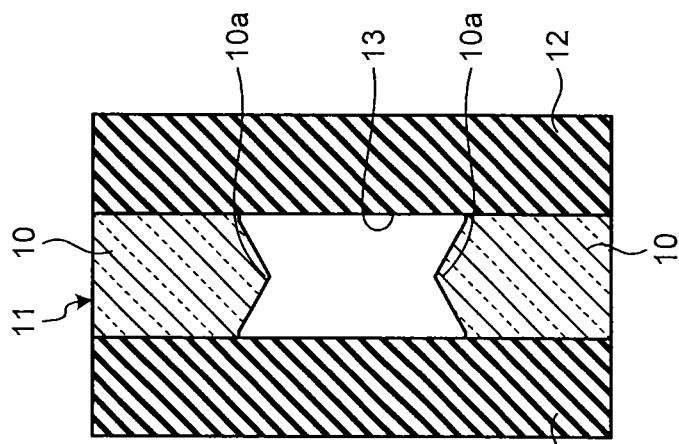
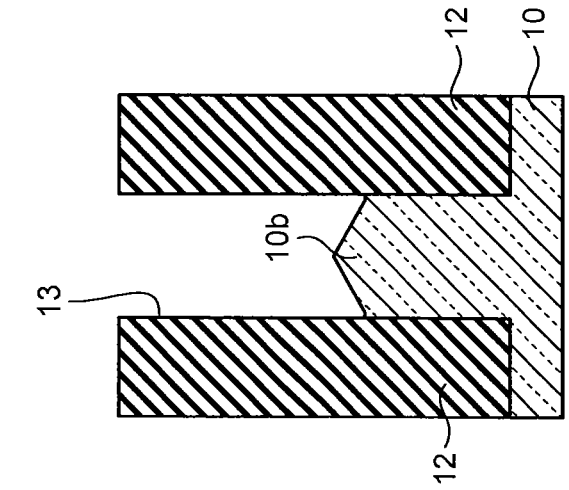
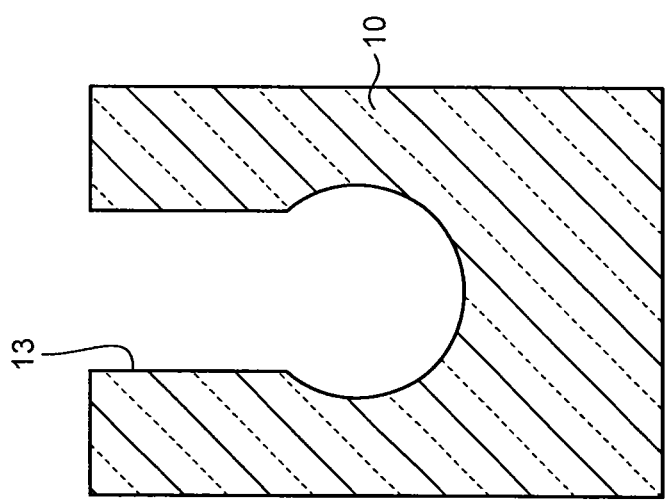

A-A' CROSS-SECTIONAL VIEW

B-B' CROSS-SECTIONAL VIEW

C-C' CROSS-SECTIONAL VIEW

A-A' CROSS-SECTIONAL VIEW

B-B' CROSS-SECTIONAL VIEW

C-C' CROSS-SECTIONAL VIEW

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2011-205452, filed on Sep. 21, 2011; the entire contents of which are incorporated herein by reference.

FIELD

Embodiments described herein relate generally to a semiconductor device and a manufacturing method thereof.

BACKGROUND

Conventionally, recessed channel transistors (RCAT: Recessed Channel Array Transistors) have been developed as field effect cell transistors for semiconductor memory devices. In a recessed channel transistor, for example, a strip-shaped semiconductor region having a recess in the central portion is used as an active region, a gate electrode is arranged in this recess with a gate dielectric film formed from an oxide film or the like interposed therebetween, and source/drain regions are provided in both side surface portions of the recess.

A recessed channel transistor having such a configuration has characteristics such that the channel length can be effectively kept long while keeping the footprint of the transistor small by engraving the channel. Consequently, the recessed channel transistor can suppress short channel effects.

However, the recessed channel transistor has a problem in that the leakage current between the drain region and the gate electrode when the transistor is off increases. Specifically, the recessed channel transistor has source/drain regions arranged in parallel with the gate electrode in a recess direction. Moreover, the gate electrode is manufactured by embedding it in a substrate and this structure is difficult to make such that only the oxide film between the source/drain regions and the gate electrode is thicker than other portions. Therefore, the contact area between the source/drain regions and the gate electrode is large compared with conventional planar transistors and the tunnel distance between the source/drain regions and the gate electrode is short, thus, the tunnel current between the drain region and the gate electrode becomes significant as the leakage current (off-leakage current) when the transistor is off.

BRIEF DESCRIPTION OF THE DRAWINGS

FIG. 2A to FIG. 2C are diagrams schematically illustrating the structure of the recessed channel transistor according to the first embodiment;

FIG. 3A to FIG. 3C are cross-sectional views illustrating other examples of the shape of an interface in a drain region, which is in contact with a gate dielectric film;

FIG. 5A to FIG. 5C are diagrams illustrating the example of a manufacturing method of the recessed channel transistor according to the first embodiment;

FIG. 6A to FIG. 6F are diagrams illustrating the example of a manufacturing method of the recessed channel transistor according to the first embodiment;

FIG. 7A to FIG. 7C are diagrams illustrating the example of a manufacturing method of the recessed channel transistor according to the first embodiment;

FIG. 8A to FIG. 8C are diagrams illustrating the example of a manufacturing method of the recessed channel transistor according to the first embodiment;

FIG. 9A to FIG. 9C are diagrams illustrating the example of a manufacturing method of the recessed channel transistor according to the first embodiment;

FIG. 10A to FIG. 10F are diagrams illustrating the example of a manufacturing method of the recessed channel transistor according to the first embodiment;

FIG. 11A to FIG. 11C are diagrams schematically illustrating the structure of a recessed channel transistor according to a second embodiment;

FIG. 12A to FIG. 12C are cross-sectional views illustrating other examples of the shape of an interface of a semiconductor substrate, which is a semiconductor region in which a channel is formed and is in contact with a gate dielectric film formed in an arcuate region of a gate trench;

FIG. 14A to FIG. 14C are diagrams illustrating the example of a manufacturing method of the recessed channel transistor according to the second embodiment;

DETAILED DESCRIPTION

Figure 1:
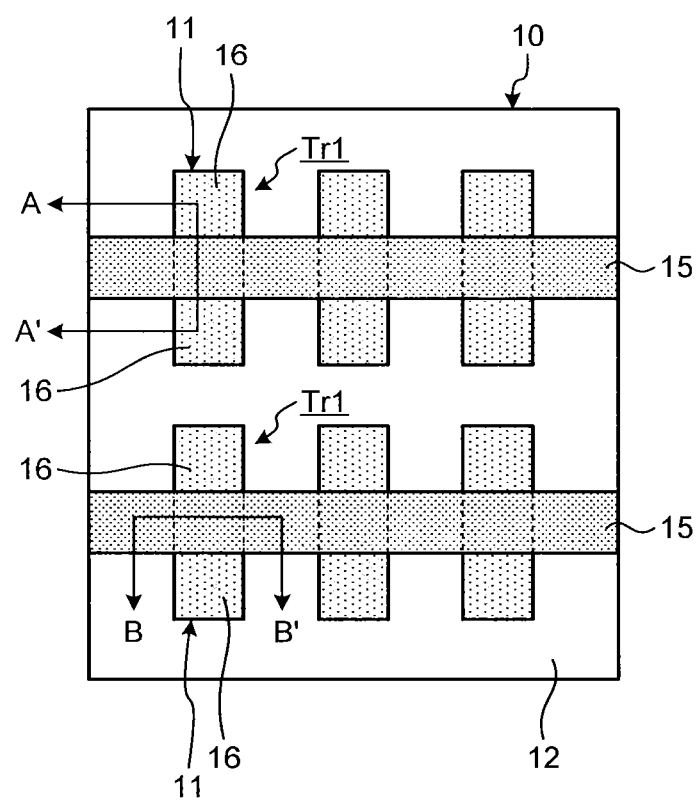
FIG. 1 is a plan view schematically illustrating the structure of recessed channel transistors according to a first embodiment.

In general, according to one embodiment, semiconductor device includes an element region partitioned by an isolation region in a semiconductor substrate, and a source region and a drain region formed in a surface layer of the element region by being isolated by a gate trench provided in the surface layer of the element region along a predetermined direction across the element region. Moreover, the semiconductor device according the embodiments includes a gate electrode formed to reach a position deeper than the source region and the drain region by embedding at least part thereof in the gate trench with a gate dielectric film interposed therebetween. An interface in the drain region, which is in contact with the gate dielectric film, includes a projection projecting toward the gate electrode side.

A semiconductor device and a manufacturing method thereof according to the embodiments will be explained below in detail with reference to the accompanying drawings. The present invention is not limited to these embodiments. In the drawings illustrated below, the scale of each component is different from the scale in reality in some cases for ease of understanding. The same is also true for the drawings. Moreover, plan views are hatched in some cases to facilitate the reading of the drawings.

First Embodiment

FIG. 1 is a plan view schematically illustrating the structure of recessed channel transistors Tr1 (hereinafter, called transistors Tr1 in some cases) according to the first embodiment. FIG. 2A to FIG. 2C are diagrams schematically illustrating the structure of the recessed channel transistor Tr1 according to the first embodiment, in which FIG. 2A is a longitudinal cross-sectional view of a main part along line A-A' in FIG. 1, FIG. 2B is a longitudinal cross-sectional view of a main part along line B-B' in FIG. 1, and FIG. 2C is a transverse cross-sectional view of a main part along line C-C' in FIG. 2A. FIG. 1 illustrates the recessed channel transistors Tr1 focusing on a semiconductor substrate 10, element regions 11, source/drain regions 16 that are impurity diffusion layers, and gate electrodes 15, and other components are omitted in FIG. 1.

The transistor Tr1 is formed in the element region 11, which is partitioned by an isolation region 12 having a STI (Shallow Trench Isolation) structure formed on the surface layer of the semiconductor substrate 10, and includes a gate dielectric film 14, the gate electrode 15, and the source/drain regions 16.

The semiconductor substrate 10 is, for example, a p-type silicon substrate containing a P-type impurity. The source/drain regions 16 in this case are n-type impurity diffusion layers containing an n-type impurity. The configuration of the semiconductor substrate 10 is not specifically limited and configurations normally used for semiconductors can be used for the semiconductor substrate 10. The isolation region 12 is formed from a silicon oxide ($SiO_2$) film. In FIG. 2B, the height of the isolation region 12 is set higher than the upper surface of the semiconductor substrate 10 in the element region forming a channel CH (lower surface of the gate dielectric film 14), however, the height of the isolation region 12 is not limited to this and may be set to any position with respect to the upper surface of the semiconductor substrate 10 described above.

In the longitudinal cross section along a surface vertical to a gate width direction as shown in FIG. 2A, a gate trench 13 has a flask shape in which a vertical region engraved substantially vertically from the surface of the semiconductor substrate 10 communicates with an arcuate region arcuately engraved under the vertical region. The arcuate region is partially wider than the vertical region in a plane direction vertical to the gate width direction. The lower end position of the vertical region is substantially equal to the lower end position of the source/drain regions 16.

The gate dielectric film 14 is formed on the inner wall of the gate trench 13 and is formed such that the thickness in the vertical region of the gate trench 13 is larger than the thickness in the arcuate region of the gate trench 13. The thickness of the gate dielectric film 14 is not uniform and the thickness in the vertical region of the gate trench 13 is made larger, therefore, the tunnel current between the source/drain regions 16 and the gate electrode 15 and the capacitance of the gate dielectric film 14 can be reduced.

The gate electrode 15 includes a polysilicon layer 15a and a low resistance layer 15b formed on the polysilicon layer 15a, and has a flask shape that follows the shape of the gate trench 13. The polysilicon layer 15a is formed such that part thereof is embedded in the gate trench 13 and part thereof projects from the surface of the semiconductor substrate 10. In other words, the polysilicon layer 15a is formed to reach a position deeper than the source/drain regions 16 in the thickness direction of the semiconductor substrate 10. The low resistance layer 15b is formed from a metal film or a silicide layer.

The source/drain regions 16 are formed in the surface layer of the semiconductor substrate 10 with part of the polysilicon layer 15a of the gate electrode 15 embedded in the gate trench 13 in the element region 11 therebetween, therefore, the source/drain regions 16 include a source region 16s on one side and a drain region 16d on the other side. Although the height of the source/drain regions 16 is not specifically limited, the height thereof in this embodiment is, for example, set to 5 nm.

Diffusion layer contacts 18 made of a conductive material are connected to the source/drain regions 16. The diffusion layer contacts 18 are each insulated from the gate electrode 15 by a sidewall portion 17 formed from a dielectric film and cause current to flow between the source/drain regions 16 and the wiring layer (not shown) provided on the upper layer thereof.

The channel CH is formed between two source/drain regions 16 to be adjacent to the gate dielectric film 14 in the semiconductor substrate 10 of the element region 11.

In the recessed channel transistor Tr1 according to the first embodiment described above, as shown in FIG. 2C, the interfaces (sides opposed to the polysilicon layer 15a of the gate electrode 15 with the gate dielectric film 14 therebetween) in the source/drain regions 16, which are in contact with the gate dielectric film 14, have a projecting shape projecting toward the gate electrode 15 side. In other words, in the plane direction of the semiconductor substrate 10, a triangular projection 16da, whose substantially central portion in the gate width direction is projected toward the gate electrode 15 side, is formed at the interface in the drain region 16d, which is in contact with the gate dielectric film 14. Moreover, a triangular projection 16sa, whose substantially central portion in the gate width direction is projected toward the gate electrode 15 side, is formed at the interface in the source region 16s, which is in contact with the gate dielectric film 14.

In the recessed channel transistor Tr1, the tunnel current (leakage current) between the drain region 16d and the gate electrode 15 when the transistor is off, i.e., when the gate voltage is 0 V and the drain voltage is the power supply voltage, becomes large compared with a planar transistor due to its structure. This tunnel current (leakage current) increases as the effective magnitude of the electric field (density of electric lines of force) per unit area directed to the gate electrode 15 from the drain region 16d becomes large.

Thus, in the recessed channel transistor Tr1 according to the first embodiment, the shape of the interface in the drain region 16d, which is in contact with the gate dielectric film 14, is a projecting shape projecting toward the gate electrode 15 side. This projecting shape is formed across the entire width in the height direction at the interface. The drain region 16d has such a projecting shape, therefore, the electric lines of force directed to the gate electrode 15 from the drain region 16d can be dispersed in the plane direction of the semiconductor substrate 10, as indicated by the arrows in FIG. 2C. Consequently, in the recessed channel transistor Tr1, it is possible to reduce the effective magnitude of the electric field (density of electric lines of force) per unit area directed to the gate electrode 15 from the drain region 16d when the transistor is off, i.e., when the gate voltage is 0 V and the drain voltage is the power supply voltage, therefore, the tunnel current (leakage current) between the drain region 16d and the gate electrode 15 when the transistor is off can be reduced.

The projecting shape described above is preferably formed across the entire width in the height direction at the interface in the drain region 16d, which is in contact with the gate dielectric film 14, however, the projecting shape may be partially formed in the height direction. Moreover, the shape of the drain region 16d described above can be also applied to a transistor having a structure that shares the source/drain region 16 with an adjacent transistor.

Moreover, the projecting shape described above is not limited to the triangular shape shown in FIG. 2C. FIG. 3A to FIG. 3C are cross-sectional views illustrating other examples of the shape of the interface in the drain region 16d, which is in contact with the gate dielectric film 14, and are diagrams corresponding to FIG. 2C. FIG. 3A illustrates an example of a triangular shape in which a portion near the central portion in the gate width direction is projected toward the gate electrode 15 side and the outer peripheral portions in the gate width direction are flat. FIG. 3B illustrates an example of a trapezoidal shape in which a portion near the central portion in the gate width direction in the triangular shape in FIG. 2C has a flat surface. FIG. 3C illustrates an example of a smooth curved shape like an arcuate shape.

Moreover, FIG. 2C and FIG. 3A to FIG. 3C illustrate a case where the interface in the source region 16s, which is in contact with the gate dielectric film 14, also has a projecting shape projecting toward the gate electrode 15 side, however, from the viewpoint of obtaining the effects described above, the interface in the source region 16s, which is in contact with the gate dielectric film 14, may have a flat surface substantially vertical to the plane direction of the semiconductor substrate 10.

Next, the manufacturing method of the recessed channel transistor Tr1 according to the first embodiment configured as above will be explained with reference to FIG. 4A to FIG. 10F. FIG. 4A to FIG. 10F are diagrams illustrating an example of the manufacturing method of the recessed channel transistor Tr1 according to the first embodiment. In FIG. 4A to FIG. 4C, FIG. 5A to FIG. 5C, and FIG. 7A to FIG. 9C, Figure XA (X: 4, 5, and 7 to 9) is a longitudinal cross-sectional view of a main part corresponding to FIG. 2A, Figure XB (X: 4, 5, and 7 to 9) is a longitudinal cross-sectional view of a main part corresponding to FIG. 2B, and Figure XC (X: 4, 5, and 7 to 9) is a transverse cross-sectional view of a main part corresponding to FIG. 2C. FIG. 6A to FIG. 6F and FIG. 10A to FIG. 10F are longitudinal cross-sectional view of a main parts corresponding to FIG. 2A.

Figures 4A, 4B, 4C:
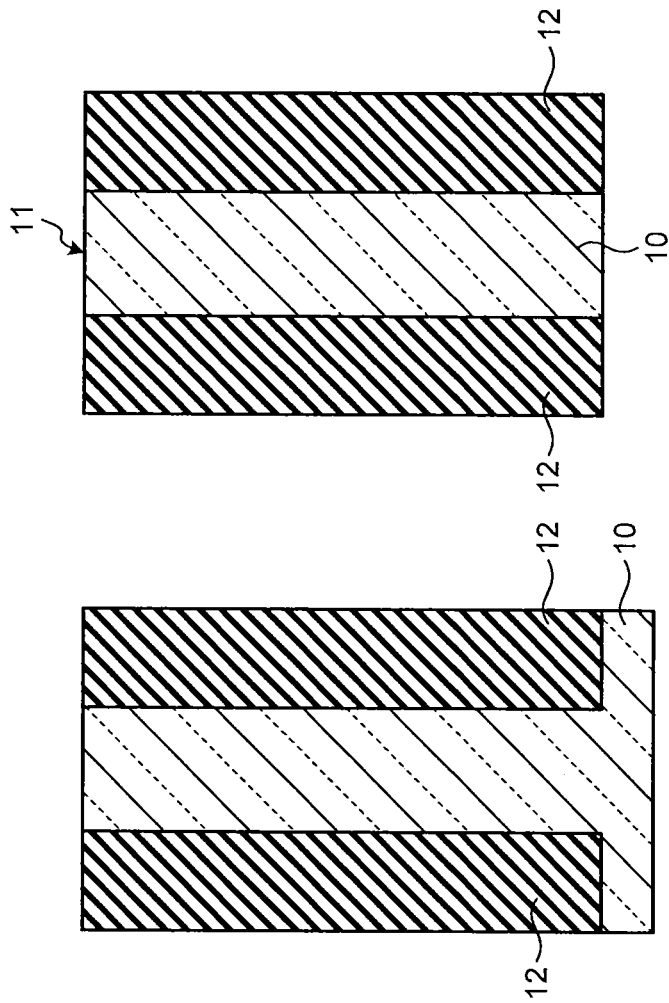
FIG. 4A to FIG. 4C are diagrams illustrating an example of a manufacturing method of the recessed channel transistor according to the first embodiment.

First, as shown in FIG. 4A to FIG. 4C, the isolation region 12 is formed on the semiconductor substrate 10 formed of a p-type silicon substrate by the STI method. Consequently, a plurality of substantially rectangular element regions 11 is defined in the surface of the semiconductor substrate 10. Next, as shown in FIG. 5A to FIG. 5C, the gate trench 13 having a flask shape in cross section along the longitudinal direction of the element region 11 is formed at a predetermined position of the element region 11. The gate trench 13 is formed linearly in a direction intersecting the element regions 11 to extend across the element regions 11 and the isolation region 12.

Among the side surfaces of the gate trench 13, a pair of side surfaces 13s opposed in the longitudinal direction of the element region 11 are silicon surfaces of the semiconductor substrate 10 and the other pair of the side surfaces are side surfaces of the isolation region 12. Moreover, a pair of the side surfaces 13s formed from silicon surfaces are surfaces having a (100) surface orientation. It is sufficient that at least the surface orientation of the side surface on the side on which the drain region 16d is formed in the recessed channel transistor Tr1 is a (100) surface among a pair of the side surfaces 13s formed from silicon surfaces.

The gate trench 13 is formed, for example, as follows. FIG. 6A to FIG. 6F are cross-sectional views illustrating an example of a forming method of the gate trench 13 and are longitudinal cross-sectional views of a main part corresponding to FIG. 2A. First, as shown in FIG. 6A, a silicon nitride film 101 is formed on the semiconductor substrate 10 as a protective film, for example, by the CVD (Chemical Vapor Deposition) method. Next, an opening pattern is formed in the silicon nitride film 101 by selectively removing the silicon nitride film 101 corresponding to the region in which a gate electrode is to be formed by using the photolithography and the RIE (Reactive Ion Etching) method. Then, a substantially quadrangular prism groove 102 is formed in the element region 11 as shown in FIG. 6B by performing anisotropic etching on the semiconductor substrate 10 by the RIE method with the silicon nitride film 101 used as a mask.

Among the side surfaces of the groove 102, a pair of side surfaces 102s opposed in the longitudinal direction of the element region 11 are silicon surfaces of the semiconductor substrate 10 and the other pair of the side surfaces are side surfaces of the isolation region 12. A pair of the side surfaces 102s forming the side surfaces of the groove 102 are surfaces having a (100) surface orientation and are surfaces along the width direction (lateral direction) of the element region 11 in this embodiment.

Next, as shown in FIG. 6C, for example, a silicon oxide ($SiO_2$) film 103 is deposited on the semiconductor substrate 10 including the inner wall of the groove 102 by the CVD method. Next, sidewall processing is performed that strips an unnecessary portion of the silicon oxide film 103 while leaving the silicon oxide film 103 on the sidewall of the groove 102 as shown in FIG. 6D, by using the photolithography process and the RIE method.

Next, isotropic etching is performed on the bottom portion of the groove 102 by wet etching with the silicon oxide film 103 left on the sidewall of the groove 102 and the silicon nitride film 101 used as a mask. Consequently, as shown in FIG. 6E, the bottom portion of the groove 102 is processed into an arcuate shape in longitudinal cross section along the longitudinal direction of the element region 11. Thereafter, the silicon oxide film 103 left on the sidewall of the groove 102 and the silicon nitride film 101 are stripped, whereby the gate trench 13 having a flask shape in longitudinal cross section along the longitudinal direction of the element region 11 as shown in FIG. 6F is obtained. Moreover, the gate trench 13 is formed such that a pair of the side surfaces 13s opposed in the longitudinal direction of the element region 11 have a (100) surface orientation.

Next, as shown in FIG. 7A to FIG. 7C, a projection 10a projecting toward the inside of the gate trench 13 is formed on a pair of the side surfaces 13s of the gate trench 13 by epitaxial growth. The projection 10a is formed into a triangular projecting shape, in which a substantially central portion in the lateral direction of the element region 11 projects toward the inside of the gate trench 13 in the plane direction of the semiconductor substrate 10, by epitaxially growing silicon on a pair of the side surfaces 13s formed from silicon surfaces having a (100) surface orientation. In the above, an explanation is given of a case where the projection 10a is formed by epitaxial growth, however, the projection 10a may be formed by using the lithography process and the RIE method when the gate trench 13 shown in FIG. 5A to FIG. 6F is formed. Moreover, the projection 10a is formed across the entire width in the height direction in a pair of the side surfaces 13s. The shape of the projections shown in FIG. 3A to FIG. 3C can also be formed by known methods by adjusting each condition.

Next, as shown in FIG. 8A to FIG. 8C, a silicon oxide film is formed as the gate dielectric film 14 on the inner wall of the gate trench 13, for example, by thermal oxidation. Next, a polysilicon layer 15a1 is deposited on the gate dielectric film 14, for example, by the CVD method in such a way as to fill the inside of the gate trench 13. Then, as shown in FIG. 9A to FIG. 9C, the surface of the polysilicon layer 15a1 is planarized by the CMP method until the surface of the semiconductor substrate 10 is exposed.

Next, as shown in FIG. 10A, a polysilicon layer 15a2 is deposited on the surface of the semiconductor substrate 10 and moreover, a tungsten film 15bw to be a low resistance layer is deposited. Next, as shown in FIG. 10B, for example, a silicon nitride film 104 is deposited as a protective film on the surface of the semiconductor substrate 10. Then, the silicon nitride film 104 is patterned so that the silicon nitride film 104 corresponding to the region in which the gate electrode is formed is selectively left by using the photolithography process and the RIE method.

Thereafter, anisotropic etching is performed on the polysilicon layer 15a2 and the tungsten film 15bw by the RIE method with the silicon nitride film 104 used as a mask. Consequently, as shown in FIG. 10C, the gate electrode 15 composed of the polysilicon layer 15a and the low resistance layer 15b is obtained.

Next, a silicon oxide (SiO$_2$) film is deposited as a dielectric film on the surface of the semiconductor substrate 10 by the CVD method. Then, anisotropic etching is performed on the silicon oxide (SiO$_2$) by the RIE method with the silicon nitride film 104 used as a mask. Consequently, as shown in FIG. 10D, the sidewall portions 17 formed from the silicon oxide (SiO$_2$) film are formed on the side surfaces of the gate electrode 15.

Next, as shown in FIG. 10E, the source/drain regions 16 (the source region 16s and the drain region 16d) are formed by ion implantation with the silicon nitride film 104 and the sidewall portions 17 used as a mask. Next, an interlayer dielectric film (not shown) is formed on the semiconductor substrate 10 and contact holes (not shown) are formed at positions corresponding to the source/drain regions 16 (the source region 16s and the drain region 16d). Then, a conductive material is embedded in the contact holes to form the diffusion layer contacts 18 as shown in FIG. 10F. The recessed channel transistor Tr1 is formed by performing the above processes.

As described above, according to the first embodiment, the shape of the interface in the drain region 16d, which is in contact with the gate dielectric film 14, is a projecting shape projecting toward the gate electrode 15 side in the plane direction of the semiconductor substrate 10. Consequently, the electric lines of force directed to the gate electrode 15 from the drain region 16d can be dispersed in the plane direction of the semiconductor substrate 10 without increasing the footprint of the gate electrode 15. As a result, in the recessed channel transistor Tr1 according to the first embodiment, it is possible to reduce the effective magnitude of the electric field (density of electric lines of force) per unit area directed to the gate electrode 15 from the drain region 16d when the transistor is off, therefore, the tunnel current (leakage current) between the drain region 16d and the gate electrode 15 when the transistor is off can be reduced.

Thus, according to the first embodiment, it is possible to obtain a recessed channel transistor that can suppress short channel effects and the tunnel current (leakage current) between the drain region 16d and the gate electrode 15 when the transistor is off.

Second Embodiment

FIG. 11A to FIG. 11C are diagrams schematically illustrating the structure of a recessed channel transistor Tr2 (hereinafter, called a transistor Tr2 in some cases) according to the second embodiment, in which FIG. 11A is a longitudinal cross-sectional view of a main part corresponding to FIG. 2A, FIG. 11B is a longitudinal cross-sectional view of a main part corresponding to FIG. 2B, and FIG. 11C is a main part transverse cross-sectional corresponding to FIG. 2C. The recessed channel transistor Tr2 according to the second embodiment has a structure the same as that of the recessed channel transistor Tr1 according to the first embodiment except for the shape of the semiconductor substrate 10 that is in contact with the gate dielectric film 14 formed in the arcuate region of the gate trench 13. In the following, points different from the recessed channel transistor Tr1 according to the first embodiment will be explained. In the drawings illustrated in the second embodiment, components the same as those in the first embodiment are denoted by the same reference numerals and an explanation thereof is omitted.

In a recessed channel transistor, the interface at which the semiconductor region forming a channel and the gate dielectric region are in contact with each other has a curvature. The electric lines of force directed to the channel from the gate electrode when the transistor is on are dispersed due to this curvature. Therefore, the effective magnitude of the electric field (density of electric lines of force) per unit area of the channel becomes small, therefore, the controlling force of the amount of carrier flowing in the channel by the gate electrode is lowered compared with a planar transistor. As a result, the on/off ratio of the transistor degrades in the recessed channel transistor. The on/off ratio indicates the ratio of the source-drain current when the transistor is on to the source-drain current when the transistor is off.

Thus, in the recessed channel transistor Tr2 according to the second embodiment, the interface of the semiconductor substrate 10, which is the semiconductor region in which the channel CH is formed and is in contact with the gate dielectric film 14 formed in the arcuate region of the gate trench 13 at a position deeper than the source/drain regions 16 (the source region 16s and the drain region 16d), has a projecting shape projecting toward the gate electrode 15 side in the plane direction of the semiconductor substrate 10 as shown in FIG. 11B. In other words, in the recessed channel transistor Tr2, in the longitudinal cross section along the gate width direction, a triangular projection 10b, whose substantially central portion in the gate width direction is projected toward the gate electrode 15 side, is formed at the interface of the semiconductor substrate 10, which is the semiconductor region in which the channel CH is formed and is in contact with the gate dielectric film 14 formed in the bottom portion of the gate trench 13.

Consequently, as indicated by the arrows in FIG. 11B, the electric lines of force directed to the channel CH from the gate electrode 15 when the transistor is on can be concentrated on the inside region in the channel width, therefore, the effective magnitude of the electric field (density of electric lines of force) per unit area directed to the channel CH from the gate electrode 15 can be made large. As a result, in this transistor Tr, the controlling force of the channel potential can be improved by increasing the amount of carrier flowing in the channel CH, therefore, the on/off ratio of the transistor can be improved. In other words, the controlling force of the gate electrode is improved by the gate electric field surrounding the channel in the gate width direction. This projecting shape is formed over the entire periphery in the channel length direction along the arcuate region of the gate trench 13 at the above-described interface of the semiconductor substrate 10, which is in contact with the gate dielectric film 14.

Moreover, the above-described projecting shape is not limited to a triangular shape shown in FIG. 11B. FIG. 12A to FIG. 12C are cross-sectional views illustrating other examples of the shape of the interface of the semiconductor substrate 10, which is the semiconductor region in which the channel CH is formed and is in contact with the gate dielectric film 14 formed in the arcuate region of the gate trench 13, are diagrams corresponding to FIG. 11B. FIG. 12A illustrates an example of a triangular shape in which a portion near the central portion in the gate width direction is projected toward the gate electrode 15 side and the outer peripheral portions in the gate width direction are flat. FIG. 12B illustrates an example of a substantially trapezoidal shape in which a portion near the central portion in the gate width direction in the triangular shape in FIG. 11B has a flat surface. FIG. 12C illustrates an example of a smooth curved shape like an arcuate shape.

Next, the manufacturing method of the recessed channel transistor Tr2 according to the second embodiment configured as above will be explained with reference to FIG. 13A to FIG. 16C. FIG. 13A to FIG. 16C are diagrams illustrating an example of the manufacturing method of the recessed channel transistor Tr2 according to the second embodiment. In FIG. 13A to FIG. 16C, Figure XA (X: 13 to 16) is a longitudinal cross-sectional view of a main part corresponding to FIG. 11A, Figure XB (X: 13 to 16) is a longitudinal cross-sectional view of a main part corresponding to FIG. 11B, and Figure XC (X: 13 to 16) is a transverse cross-sectional view of a main part corresponding to FIG. 11C.

Figure 13A:
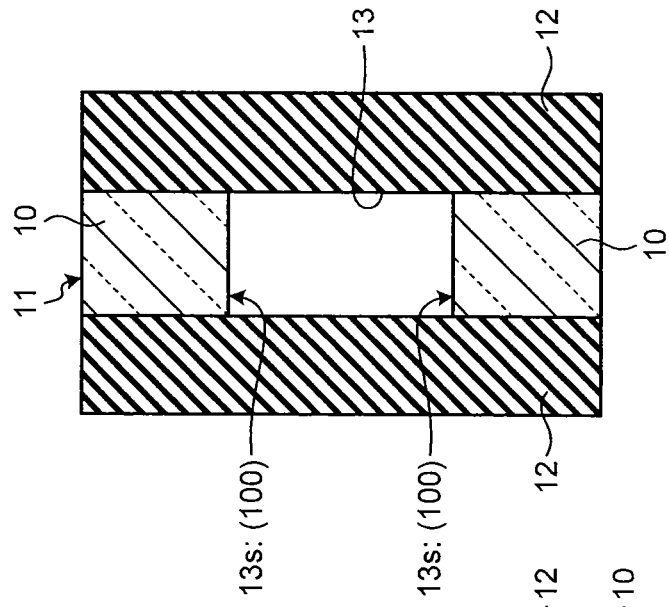
FIG. 13A to FIG. 13C are diagrams illustrating an example of a manufacturing method of the recessed channel transistor according to the second embodiment.
Figure 13B:
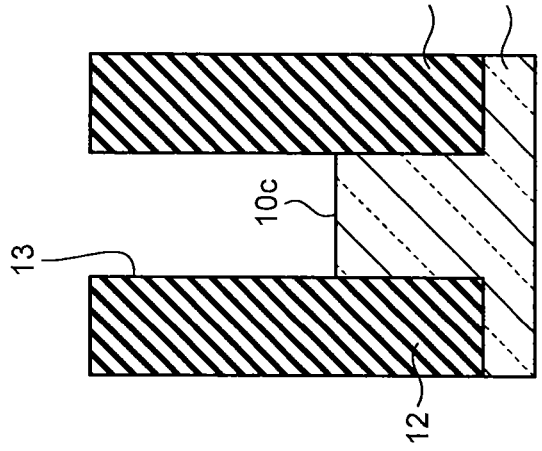
Figure 13C:
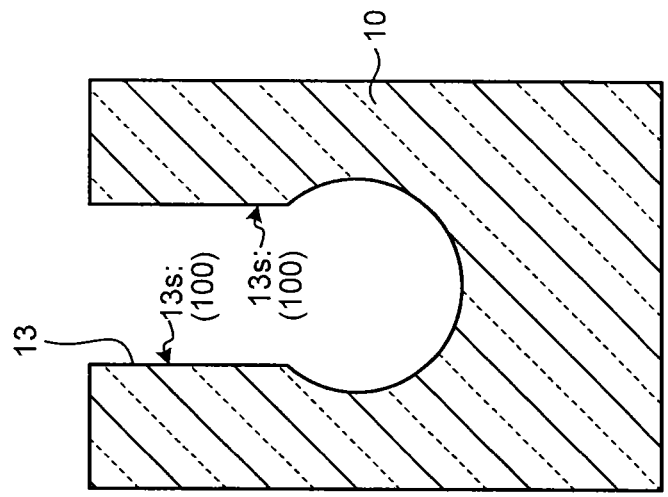

First, the processes explained with reference to FIG. 4A to FIG. 6F are performed to form the gate trench 13 having a flask shape in cross section along the longitudinal direction of the element region 11 at a predetermined position of the element region 11 as shown in FIG. 13A to FIG. 13C. In the second embodiment, a p-type silicon substrate having a (100) surface orientation on the substrate surface is used as the semiconductor substrate 10. The gate trench 13 is formed such that a pair of the side surfaces 13s opposed in the longitudinal direction of the element region 11 have a (100) surface orientation.

Next, as shown in FIG. 14A to FIG. 14C, in a similar manner to the first embodiment, the projection 10a projecting toward the inside of the gate trench 13 is formed by epitaxial growth on a pair of the side surfaces 13s of the element region 11 forming part of the side surfaces of the gate trench 13. The projection 10b projecting toward the inside of the gate trench 13 is formed by epitaxial growth on an inner wall 10c of the arcuate region arcuately engraved in the gate trench 13. A pair of the side surfaces 13s are silicon surfaces having a (100) surface orientation, therefore, the projection 10a is formed into a triangular projecting shape, in which a substantially central portion in the lateral direction of the element region 11 is projected toward the inside of the gate trench 13 in the plane direction of the semiconductor substrate 10. Moreover, a p-type silicon substrate having a (100) surface orientation on the substrate surface is used as the semiconductor substrate 10, therefore, the projection 10b is formed into a triangular projecting shape, whose substantially central portion is projected toward the inside of the gate trench 13 in cross section (FIG. 14B) along the lateral direction of the element region 11. The shape of the projections shown in FIG. 12A to FIG. 12C can also be formed by known methods by adjusting each condition.

Figure 15A:
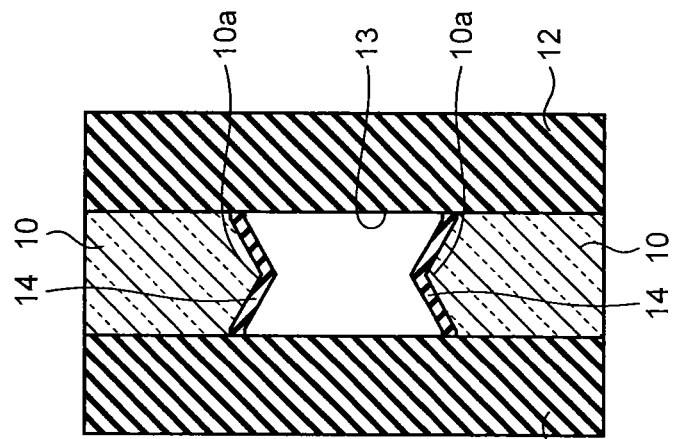
FIG. 15A to FIG. 15C are diagrams illustrating the example of a manufacturing method of the recessed channel transistor according to the second embodiment.
Figure 15B:
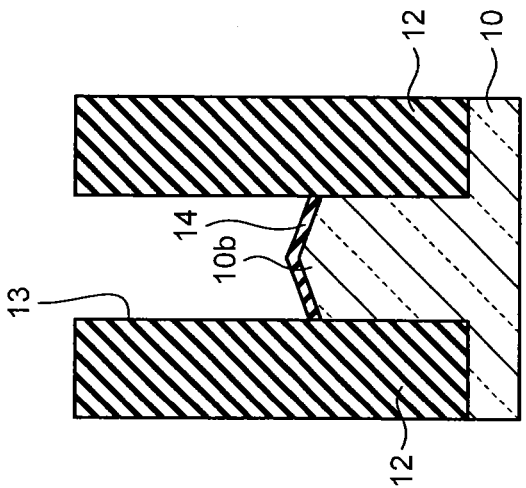
Figure 15C:
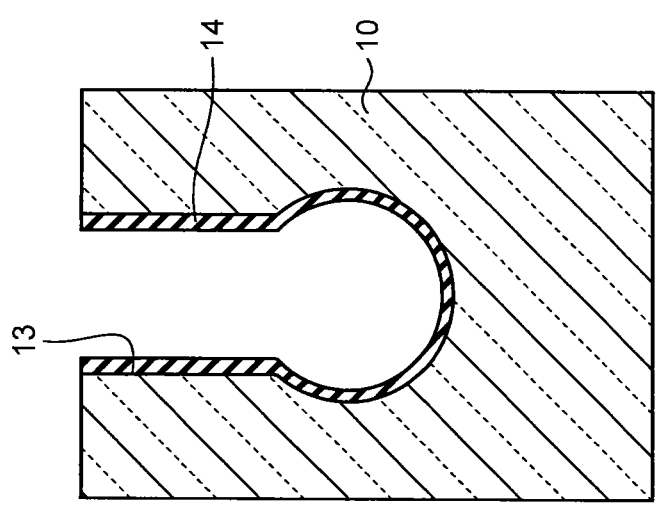
Figure 16A:
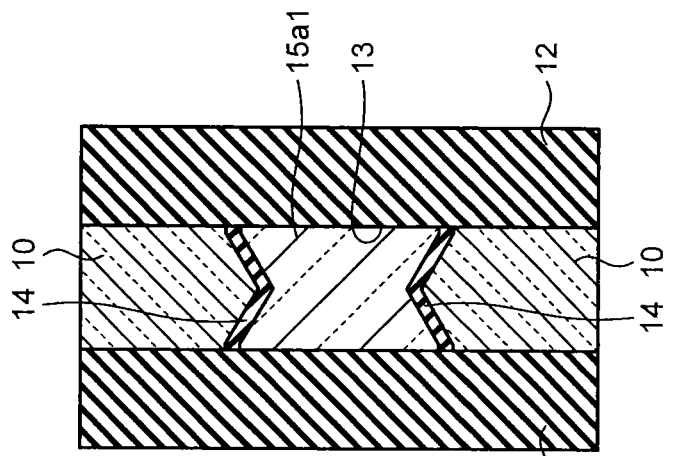
FIG. 16A to FIG. 16C are diagrams illustrating the example of a manufacturing method of the recessed channel transistor according to the second embodiment.
Figure 16B:
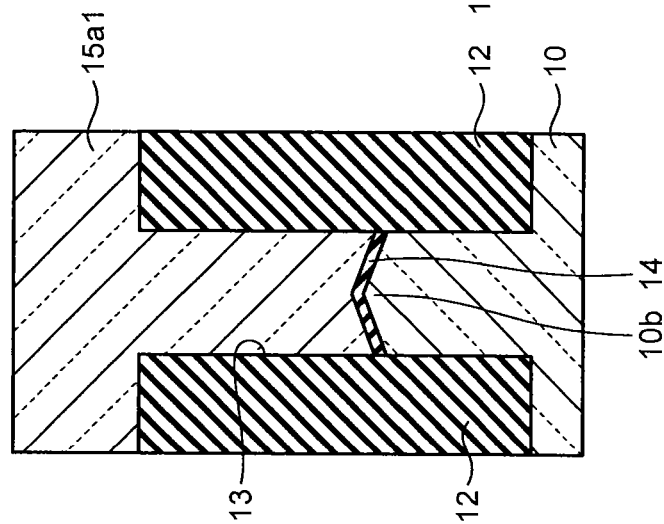
Figure 16C:
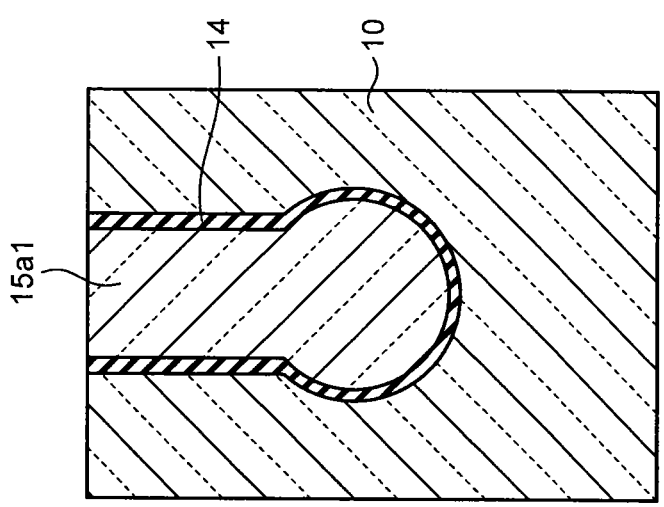

Next, as shown in FIG. 15A to FIG. 15C, a silicon oxide film is formed as the gate dielectric film 14 on the inner wall of the gate trench 13, for example, by thermal oxidation. Next, as shown in FIG. 16A to FIG. 16C, the polysilicon layer 15a1 is deposited on the gate dielectric film 14, for example, by the CVD method in such a way as to fill the inside of the gate trench 13. Then, the surface of the polysilicon layer 15a1 is planarized by the CMP method until the surface of the semiconductor substrate 10 is exposed.

Thereafter, the processes explained with reference to FIG. 10A to FIG. 10F are performed to form the recessed channel transistor Tr2.

As described above, according to the second embodiment, in the longitudinal cross section along the gate width direction, the interface of the semiconductor substrate 10, which is the semiconductor region in which the channel CH is formed and is opposed to the bottom portion of the gate electrode 15 with the gate dielectric film 14 interposed therebetween, is formed into a projecting shape projecting toward the gate electrode 15 side. Consequently, the electric lines of force directed to the channel CH from the gate electrode 15 when the transistor is on can be concentrated on the inside region in the channel width, therefore, the effective magnitude of the electric field (density of electric lines of force) per unit area directed to the channel CH from the gate electrode 15 can be made large. As a result, in this recessed channel transistor, the controlling force of the amount of carrier flowing in the channel by the gate electrode can be improved, therefore, the on/off ratio of the transistor can be improved.

Moreover, according to the second embodiment, in a similar manner to the first embodiment, the shape of the interface in the drain region 16d, which is in contact with the gate dielectric film 14, is a projecting shape projecting toward the gate electrode 15 side in the plane direction of the semiconductor substrate 10. Consequently, in the recessed channel transistor Tr2 according to the second embodiment, in a similar manner to the first embodiment, the tunnel current (leakage current) between the drain region 16d and the gate electrode 15 when the transistor is off can be reduced.

Thus, according to the second embodiment, it is possible to obtain a recessed channel transistor capable of suppressing short channel effects, reducing the tunnel current (leakage current) between the drain region 16d and the gate electrode 15 when the transistor is off, and improving the on/off ratio of the transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
an element region partitioned by an isolation region in a semiconductor substrate;
a source region and a drain region formed in a surface layer of the element region by being isolated by a gate trench provided in the surface layer of the element region along a predetermined direction across the element region; and
a gate electrode formed to reach a position deeper than the source region and the drain region by embedding at least part thereof in the gate trench with a gate dielectric film interposed therebetween, wherein
an interface in the drain region, which is in contact with the gate dielectric film, includes a first projection having a portion near a central position in the gate width direction projected toward the gate electrode side.

2. The semiconductor device according to claim 1, wherein the first projection is provided across an entire width in a thickness direction of the semiconductor substrate at the interface in the drain region.

3. The semiconductor device according to claim 1, wherein
the gate trench includes a region, which is wider than a width between the source region and the drain region in a direction orthogonal to the predetermined direction, at a position deeper than the source region and the drain region, and
the gate dielectric film is such that a thickness of a region, which is in contact with the interface in the drain region, is larger than a thickness of a region, which is in contact with an inner wall of the wider region.

4. The semiconductor device according to claim 1, wherein the first projection has any one of a triangular shape, a trapezoidal shape, and an arcuate shape projecting toward the gate electrode side in a plane direction of the semiconductor substrate.

5. The semiconductor device according to claim 1, wherein
the semiconductor substrate is a silicon substrate, and
the first projection is an epitaxially grown layer of silicon.

6. The semiconductor device according to claim 5, wherein a surface vertical to the predetermined direction in the drain region is a (100) surface.

7. The semiconductor device according to claim 1, wherein an interface in the semiconductor substrate, which is in contact with the gate dielectric film at a position deeper than the source region and the drain region in the element region, includes a second projection projecting toward the gate electrode side.

8. The semiconductor device according to claim 7, wherein the second projection is provided along a plane direction vertical to the predetermined direction.

9. The semiconductor device according to claim 7, wherein the second projection has any one of a triangular shape, a trapezoidal shape, and an arcuate shape projecting toward the gate electrode side.

10. The semiconductor device according to claim 9, wherein
the semiconductor substrate is a silicon substrate, and
the second projection is an epitaxially grown layer of silicon.

11. The semiconductor device according to claim 10, wherein a substrate surface of the semiconductor substrate is a (100) surface.

12. A manufacturing method of a semiconductor device comprising:
forming an element region partitioned by an isolation region in a surface layer portion of a semiconductor substrate;
forming a gate trench in part of a surface layer of the element region along a predetermined direction across the element region;
forming a first projection having a portion near a central position in the predetermined direction projected toward an inside of the gate trench on one side surface along the predetermined direction in the gate trench;
forming a gate dielectric film on an entire surface of an inner surface of the gate trench;
forming a gate electrode, which is embedded in the gate trench with the gate dielectric film interposed therebetween and which projects from a surface of the semiconductor substrate on the gate trench; and
forming a drain region, which has a lower end at a position shallower than the gate trench and is in contact with the gate dielectric film, in one region on one side surface side having the first projection, and forming a source region, which has a lower end at a position shallower than the gate trench and is in contact with the gate dielectric film, in another region, in two regions opposed to each other with the gate trench therebetween in the surface layer of the isolation region.

13. The manufacturing method of a semiconductor device according to claim 12, wherein the first projection is provided across an entire width in a thickness direction of the semiconductor substrate on one side surface along the predetermined direction in the gate trench.

14. The manufacturing method of a semiconductor device according to claim 12, wherein the first projection has any one of a triangular shape, a trapezoidal shape, and an arcuate shape projecting toward the gate electrode side in a plane direction of the semiconductor substrate.

15. The manufacturing method of a semiconductor device according to claim 14, wherein
the semiconductor substrate is a silicon substrate, and
the first projection is formed by epitaxially growing silicon.

16. The manufacturing method of a semiconductor device according to claim 15, wherein one side surface along the predetermined direction in the gate trench is a (100) surface.

17. The manufacturing method of a semiconductor device according to claim 12, wherein a second projection projecting toward an inside of the gate trench is formed in an inner surface of the gate trench at a position deeper than a formation position of the source region and the drain region in the element region before forming the gate dielectric film.

18. The manufacturing method of a semiconductor device according to claim 17, wherein the second projection has any one of a triangular shape, a trapezoidal shape, and an arcuate shape projecting toward the gate electrode side.

19. The manufacturing method of a semiconductor device according to claim 18, wherein
the semiconductor substrate is a silicon substrate, and
the second projection is formed by epitaxially growing silicon.

20. The manufacturing method of a semiconductor device according to claim 19, wherein a substrate surface of the semiconductor substrate is a (100) surface.

* * * * *